(12) United States Patent
Shimamoto

(10) Patent No.: US 11,676,825 B2
(45) Date of Patent: *Jun. 13, 2023

(54) SEMICONDUCTOR CHIP

(71) Applicant: Murata Manufacturing Co., Ltd., Kyoto-fu (JP)

(72) Inventor: Kenichi Shimamoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 46 days.

This patent is subject to a terminal disclaimer.

(21) Appl. No.: 17/196,775

(22) Filed: Mar. 9, 2021

(65) Prior Publication Data
US 2021/0193484 A1    Jun. 24, 2021

Related U.S. Application Data

(63) Continuation of application No. 16/242,987, filed on Jan. 8, 2019, now Pat. No. 10,971,377, which is a
(Continued)

(51) Int. Cl.
*H01L 21/56* (2006.01)
*H01L 23/498* (2006.01)
(Continued)

(52) U.S. Cl.
CPC ...... *H01L 21/563* (2013.01); *H01L 23/49816* (2013.01); *H01L 24/14* (2013.01);
(Continued)

(58) Field of Classification Search
CPC .................. H01L 2224/1712–1714; H01L 2224/1412–1414;
(Continued)

(56) References Cited

U.S. PATENT DOCUMENTS 3,250,851 A    5/1966    Boening
3,549,107 A    12/1970   Zimmer
(Continued)

FOREIGN PATENT DOCUMENTS

CN    208062050 U    11/2018
JP    2007194305 A    8/2007
TW    201406053 A    2/2014

OTHER PUBLICATIONS

NXP product data sheet for BC847QAS, pp. 1-13, Jul. 8, 2015 (Year: 2015).*

(Continued)

*Primary Examiner* — Vincent Wall
(74) *Attorney, Agent, or Firm* — Studebaker & Brackett PC

(57) ABSTRACT

A semiconductor chip has a first transistor that amplifies a first signal and outputs a second signal, a second transistor that amplifies the second signal and outputs a third signal, and a semiconductor substrate having a main surface parallel to a plane defined by first and second directions and which has the first and second transistors formed thereon. The main surface has thereon a first bump connected to a collector or drain of the first transistor, a second bump connected to an emitter or source of the first transistor, a third bump connected to a collector or drain of the second transistor, and a fourth bump connected to an emitter or source of the second transistor. The first bump is circular, the second through fourth bumps are rectangular or oval, and the area of each of the second through fourth bumps is larger than that of the first bump.

14 Claims, 10 Drawing Sheets

Related U.S. Application Data continuation of application No. 15/849,065, filed on Dec. 20, 2017, now Pat. No. 10,211,073.

(60) Provisional application No. 62/451,163, filed on Jan. 27, 2017.

(51) Int. Cl.
  *H01L 23/00* (2006.01)
  *H03F 3/195* (2006.01)

(52) U.S. Cl.
  CPC ............ *H01L 24/81* (2013.01); *H03F 3/195* (2013.01); *H01L 24/13* (2013.01); *H01L 24/16* (2013.01); *H01L 2224/11003* (2013.01); *H01L 2224/11334* (2013.01); *H01L 2224/13014* (2013.01); *H01L 2224/13101* (2013.01); *H01L 2224/13147* (2013.01); *H01L 2224/1403* (2013.01); *H01L 2224/1416* (2013.01); *H01L 2224/14051* (2013.01); *H01L 2224/14152* (2013.01); *H01L 2224/14519* (2013.01); *H01L 2224/16225* (2013.01); *H01L 2224/81801* (2013.01); *H01L 2924/1304* (2013.01); *H01L 2924/1306* (2013.01); *H01L 2924/13051* (2013.01); *H01L 2924/13054* (2013.01); *H01L 2924/13091* (2013.01); *H01L 2924/1424* (2013.01); *H03F 2200/411* (2013.01); *H03F 2200/451* (2013.01)

(58) Field of Classification Search
  CPC ... H01L 2224/0605–06051; H01L 2924/1306; H03F 3/195; H03F 2200/411; H03F 2200/451
  See application file for complete search history.

(56) References Cited

U.S. PATENT DOCUMENTS

| | | | |
|---|---|---|---|
| 5,371,029 A | 12/1994 | Abdo et al. | |
| 5,796,169 A | 8/1998 | Dockerty et al. | |
| 6,097,097 A | 8/2000 | Hirose | |
| 6,700,177 B2 | 3/2004 | Yoshisato et al. | |
| 7,564,130 B1 | 7/2009 | Li | |
| 8,841,779 B2 | 9/2014 | Pendse | |
| 8,860,507 B2 | 10/2014 | Chen et al. | |
| 10,211,073 B2 | 2/2019 | Shimamoto | |
| 2002/0011658 A1 | 1/2002 | Yoshisato et al. | |
| 2004/0232982 A1 | 11/2004 | Ichitsubo et al. | |
| 2005/0077624 A1* | 4/2005 | Tan | H01L 24/11 257/737 |
| 2005/0212604 A1 | 9/2005 | Cyr et al. | |
| 2008/0048317 A1 | 2/2008 | Krueger et al. | |
| 2009/0008764 A1 | 1/2009 | Lee et al. | |
| 2012/0098120 A1 | 4/2012 | Yu et al. | |
| 2012/0286878 A1 | 11/2012 | Dening et al. | |
| 2013/0026614 A1 | 1/2013 | Yu et al. | |
| 2013/0062763 A1 | 3/2013 | Chan et al. | |
| 2014/0323066 A1 | 10/2014 | Zhang et al. | |
| 2015/0054178 A1 | 2/2015 | Ishii et al. | |
| 2017/0271243 A1 | 9/2017 | Yosui et al. | |
| 2017/0338172 A1 | 11/2017 | Yosui et al. | |
| 2018/0218921 A1 | 8/2018 | Shimamoto | |
| 2019/0123003 A1 | 4/2019 | Namie et al. | |

OTHER PUBLICATIONS

Darlington Transistor and the Szikali Darlington Pair, https://web.archive.org/web/20140228071007/http://www.electronics-tutorials.ws/category/transistor, Feb. 28, 2014 (Year: 2014).*

NXP product data sheet for BC847QAS, pp. 1-13, Jul. 8, 2015.

Darlington Transistor and the Szikali Dariington Pair, https://web.archive.org/web/20140228071007/http:// www.electronics-tutorials.ws/category/transistor, Feb. 28, 2014.

ZXTDA 1 M832 product cover sheet, Jun. 2002.

STS05DRP03 product data sheet, Mar. 2009.

NXP product data sheet for BC847ZQAS, Nexperia, 45 V, 200 mA NPN/NPN general-purpose transistor, Sep. 10, 2018, 12 pages.

ST TS4995 "1.2 W fully differential audio power amplifier with selectable standby and 6 dB fixed gain" spec sheet, Mar. 2008, pp. 1-26.

JoJo, "Class A Power Amplifier—Tutorial with Design and Theory" http://www.circuitstoday.com/class-a-poweramplifiers, pp. 1-9, Feb. 20, 2014.

* cited by examiner

SEMICONDUCTOR CHIP

CROSS-REFERENCE TO RELATED APPLICATION

This application is a Continuation of U.S. application Ser. No. 16/242,987 filed Jan. 8, 2019, which is a Continuation of U.S. application Ser. No. 15/849,065 filed Dec. 20, 2017, which claims benefit of priority to U.S. Provisional Patent Application No. 62/451,163, filed Jan. 27, 2017, the entire content of which is incorporated herein by reference.

BACKGROUND

Technical Field

The present disclosure relates to a semiconductor chip.

Description of Related Art

As a method for mounting a semiconductor chip on a substrate, there is a flip chip technology using bumps. In general, the flip chip technology is advantageous in that a mounting area can be reduced, as compared with wire bonding.

SUMMARY

A mobile communication device, such as, for example, a cellular phone, uses a power amplifier circuit. A transistor used to amplify power in the power amplifier circuit has a temperature characteristic. Therefore, when the transistor generates heat due to its amplifying operation, an increase in temperature may change the characteristics of the transistor. Using the foregoing flip chip technology for such a power amplifier circuit will pose a problem in that heat will not be adequately dissipated, affecting the characteristics of the transistor, although the mounting area will be reduced.

The present disclosure has been made in view of the circumstances described above, and it is an object of the disclosure to provide a semiconductor chip that can reduce the influences exerted by the heat generated by a transistor while providing a reduced mounting area.

A semiconductor chip according to one aspect of the present disclosure includes: a first transistor that amplifies a first signal and outputs a second signal; a second transistor that amplifies the second signal and outputs a third signal; and a semiconductor substrate which has a main surface parallel to a plane defined by a first direction and a second direction intersecting with the first direction and which has the first transistor and the second transistor formed thereon. The main surface of the semiconductor substrate is provided with a first bump electrically connected to a collector or a drain of the first transistor, a second bump electrically connected to an emitter or a source of the first transistor, a third bump electrically connected to a collector or a drain of the second transistor, and a fourth bump electrically connected to an emitter or a source of the second transistor. In a planar view of the main surface of the semiconductor substrate, the first bump is circular, the second, the third, and the fourth bumps are rectangular or oval, and the area of each of the second, the third, and the fourth bumps is larger than the area of the first bump.

According to the present disclosure, a semiconductor chip is provided that can reduce a mounting area and also restrain the influences of the heat generated by a transistor.

DETAILED DESCRIPTION

Figure 1:
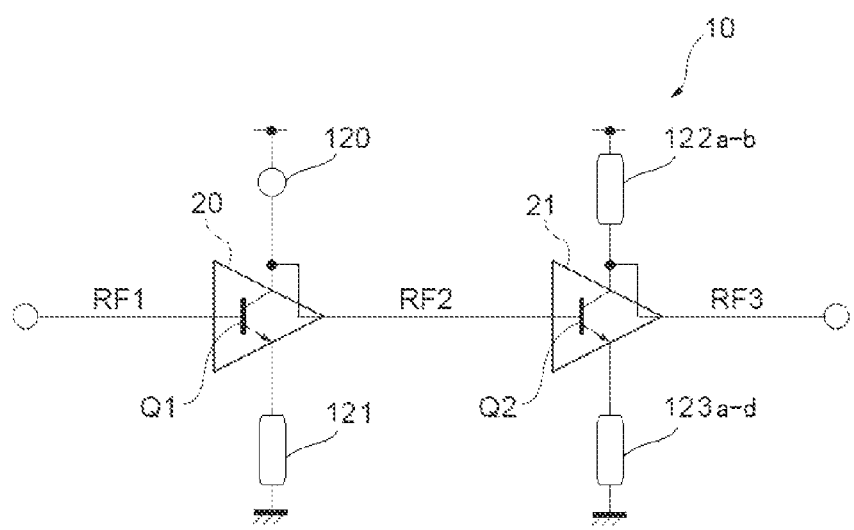
FIG. 1 is a circuit diagram of a power amplifier circuit formed on a semiconductor chip according to a first embodiment of the present disclosure.

The following will describe in detail the embodiments of the present disclosure with reference to the accompanying drawings. In the drawings, the same or similar constituent elements will be assigned the same or similar reference numerals. The drawings are illustrative and show schematic dimensions and shapes of parts. The technological scope of the present disclosure should not be interpreted as limiting the scope of the embodiments.

Figure 2:
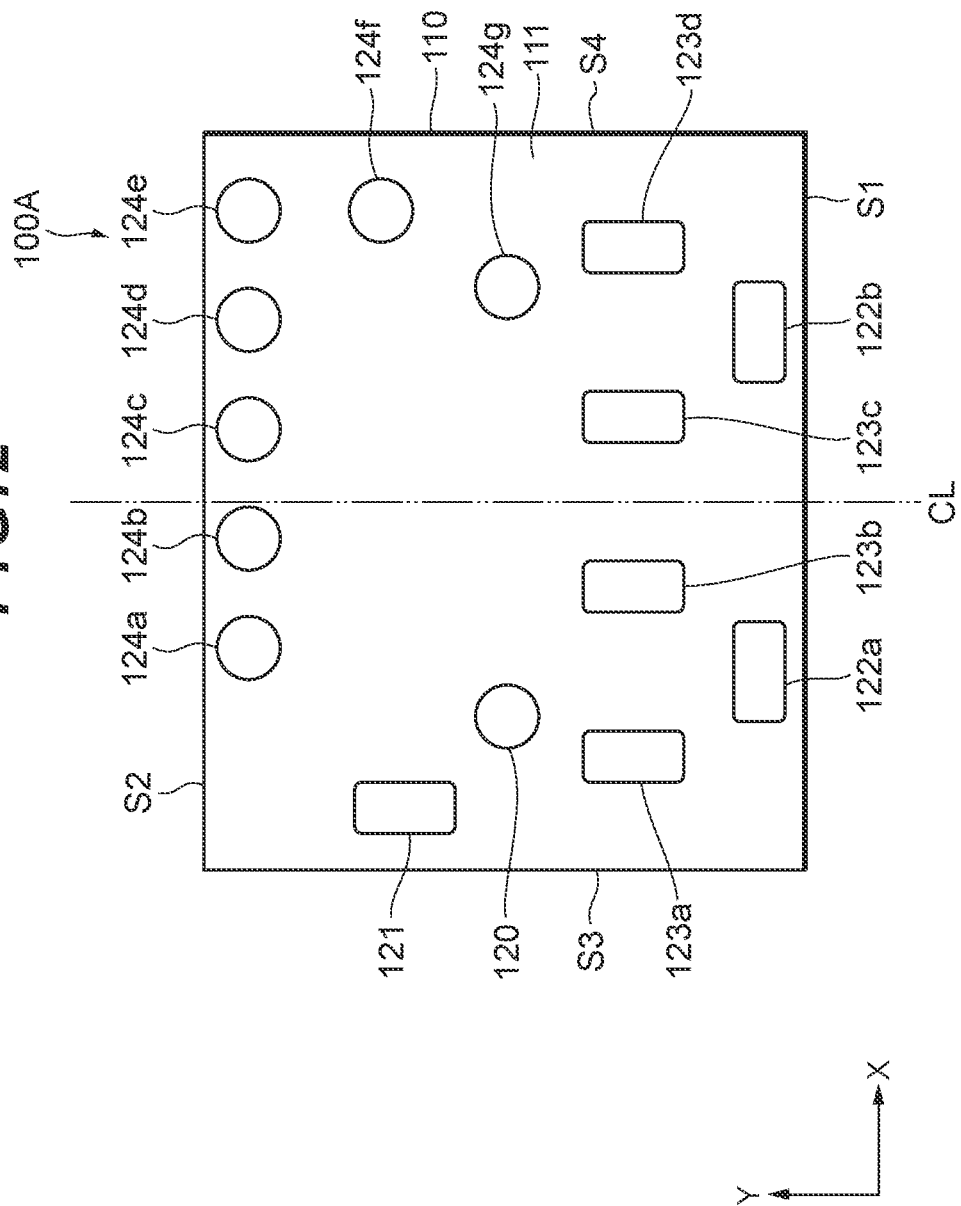
FIG. 2 is a plan view illustrating the semiconductor chip according to the first embodiment of the present disclosure.

Referring first to FIG. 1 and FIG. 2, a semiconductor chip according to a first embodiment of the present disclosure will be described. FIG. 1 is a circuit diagram of a power amplifier circuit formed on the semiconductor chip according to the first embodiment of the present disclosure, and FIG. 2 is a plan view illustrating the semiconductor chip according to the first embodiment of the present disclosure.

A power amplifier circuit 10 illustrated in FIG. 1 includes, for example, amplifiers 20 and 21. Each of the amplifiers 20 and 21 amplifies a radio frequency (RF) signal. In the present embodiment, a description will be given, assuming that the amplifiers 20 and 21 are composed of bipolar transistors, such as heterojunction bipolar transistors (HBTs). The amplifiers 20 and 21 may alternatively be composed of other types of transistors, such as metal-oxide-semiconductor field-effect transistors (MOSFETs). In this case, a base, a collector, and an emitter will be replaced by a gate, a drain, and a source.

The amplifier 20 in a first stage (driver stage) includes a transistor Q1 (a first transistor). The transistor Q1 amplifies an input signal RF1 (a first signal) and outputs an amplified signal RF2 (a second signal). The amplifier 21 in a subsequent (power stage) includes a transistor Q2 (a second transistor). The transistor Q2 further amplifies the amplified signal RF2 and outputs an amplified signal RF3 (a third signal). More specifically, an input signal RF1 is supplied to the base of the transistor Q1, and a supply voltage is supplied to the collector thereof, and the emitter thereof is grounded. The transistor Q1 amplifies the input signal RF1 and outputs the amplified signal RF2 from the collector thereof. The amplified signal RF2 is supplied to the base of the transistor Q2, a supply voltage is supplied to the collector thereof, and the emitter thereof is grounded. The transistor Q2 further amplifies the amplified signal RF2, and outputs the amplified signal RF3 from the collector thereof. Although not illustrated, the power amplifier circuit 10 may be further provided with other circuits, such as a bias circuit and a matching circuit. Further, in the present embodiment, the example in which the amplifier has two stages is illustrated. However, the number of stages of the amplifier is not limited to two, and may alternatively be three or more. Further, FIG. 1 illustrates the bipolar transistor. However, field-effect transistors (FETs) may be used in place of the bipolar transistors.

Referring now to FIG. 2, a description will be given of the semiconductor chip on which the power amplifier circuit 10 is formed. A semiconductor chip 100A illustrated in FIG. 2 includes, for example, a semiconductor substrate 110 and a plurality of bumps 120 to 124g provided on the main surface of the semiconductor substrate 110.

The semiconductor substrate 110 has, for example, a main surface 111, which is parallel to a plane defined by, for example, an X-axis direction (a first direction) and a Y-axis direction (a second direction) that intersects with (or is orthogonal in FIG. 2 to) the X-axis direction. There is no particular restriction on the material of the semiconductor substrate 110. However, the main component is, for example, a compound semiconductor. FIG. 2 is a plan view of the main surface 111 of the semiconductor substrate 110. The main surface 111 has sides S1 (a first side) and S2 (a second side) parallel to the X-axis, and sides S3 and S4 parallel to the Y-axis. Although not illustrated in FIG. 2, for example, the transistor Q1 constituting the amplifier 20 in the first stage and the transistor Q2 constituting the amplifier 21 in the subsequent stage illustrated in FIG. 1 are formed on the semiconductor substrate 110. Each of the transistors Q1 and Q2 is configured by, for example, a plurality of fingers arranged in alignment in an XY plane direction.

The semiconductor chip 100A is mounted on a module board (not illustrated) by the flip chip technology using bumps. Thus, the amplifiers 20 and 21 formed on the semiconductor chip 100A and the paths formed on the module board are electrically connected.

The module board on which the semiconductor chip 100A is mounted may be a board composed of, for example, a printed circuit board (PCB) or a low temperature co-fired ceramics (LTCC). In addition to the semiconductor chip 100A, other circuits, such as an output matching circuit of the power amplifier circuit, a duplexer which separates transmitted signals and received signals, and a switch circuit, are mounted on the module board. As the duplexer, a surface acoustic wave (SAW) filter circuit or an incredible high performance SAW (IHP-SAW) filter circuit, for example, may be used.

Bumps 120, 121, 122a, 122b, and 123a to 123d illustrated in FIG. 2 are bumps that electrically connect the collectors and the emitters of the transistors Q1 and Q2 with elements outside the semiconductor chip 100A. Further, the bumps 124a to 124g are bumps which function as the terminals for supplying, although not particularly limited to, for example, a supply voltage, an input signal, a ground potential, or a control signal, from outside the semiconductor chip 100A. Although there is no particular restriction on the bumps 120 to 124g, the bumps may be, for example, Cu pillar bumps or solder bumps. The following will specifically describe the bumps 120 to 123d.

The bump 120 (a first bump) is a bump to which the collector of each finger constituting the transistor Q1 in the first stage is electrically connected. The bump 120 is, for example, circular in the planar view of the main surface 111.

The bump 121 (a second bump) is a bump to which the emitter of each finger constituting the transistor Q1 in the first stage is electrically connected. The bump 121 is shaped like, for example, a rectangle that has a short side direction parallel to the X-axis and a long side direction parallel to the Y-axis in the planar view of the main surface 111. Further, in the planar view of the main surface 111, the area of the bump 121 is larger than the area of the bump 120. The number of bumps connected to the collector and the emitter of the transistor Q1 is one each in FIG. 2. However, the number of bumps may be plural rather than being limited to one.

The bumps 122a (a first part of a third bump) and 122b (a second part of the third bump) are the bumps to which the collector of each finger constituting the transistor Q2 in the subsequent stage are electrically connected. The bumps 122a and 122b are separately formed and placed substantially symmetrically with respect to a centerline CL in the X-axis direction of the semiconductor substrate 110. Each of the bumps 122a and 122b is shaped like, for example, a rectangle that has a long side direction parallel to the X-axis and a short side direction parallel to the Y-axis in the planar view of the main surface 111. Further, the bumps 122a and 122b are placed such that the long side directions thereof are substantially parallel to the X-axis in the vicinity of a side S1. Thus, placing the bumps 122a and 122b in the vicinity of the outer frame of the semiconductor substrate 110 shortens the path for outputting the amplified signal RF3, which is output from the transistor Q2, to the outside of the semiconductor chip. Further, in the planar view of the main surface 111, the area of each of the bumps 122a and 122b is larger than the area of the bump 120. The number of the bumps connected to the collector of the transistor Q2 is two in FIG. 2. However, the number of the bumps may be one, or three or more rather than being limited particularly to two.

The bumps 123a to 123d (fourth bumps) are the bumps to which the emitter of each finger constituting the transistor Q2 in the subsequent stage is electrically connected. In other words, the plurality of fingers constituting the transistor Q2 are arranged in alignment in the XY plane direction in the area in which the bumps 123a to 123d are disposed. The bumps 123a to 123d are separately formed in an area between the bump 120 and the bumps 122a, 122b, the four bumps being arranged in the X-axis direction so as to be substantially symmetrical with respect to the centerline CL in the X-axis direction of the semiconductor substrate 110. The bumps 123a to 123d are shaped like, for example, a rectangle that has a short side direction parallel to the X-axis and a long side direction parallel to the Y-axis in the planar view of the main surface 111. This means that the long side directions of the bumps 122a and 122b and the long side directions of the bumps 123a to 123d are orthogonal to each other. Further, in the planar view of the main surface 111, the area of each of the bumps 123a to 123d is larger than the area of the bump 120. The number of the bumps connected to the emitter of the transistor Q2 is four in FIG. 2. However, the number of the bumps may be one to three, or five or more rather than being limited particularly to four.

The shapes of the bumps 124a to 124g are not particularly restricted. However, in the present embodiment, the shapes thereof are circular in the planar view of the main surface 111. The bumps 124a to 124e (fifth bumps) are disposed in the vicinity of a side S2, which is a side opposing the side S1 of the outer frame of the semiconductor substrate 110, and along the side S2. The bump 124f is disposed in the vicinity of a side S4. The bump 124g is disposed at a position that is substantially symmetrical to the bump 120 with respect to the centerline CL.

A description will now be given of a reason why the bumps 121 to 123d are rectangular. The transistors Q1 and Q2 formed on the semiconductor chip 100A generate heat while in operation, thus causing the temperatures of the elements to increase. Transistors generally have temperature characteristics, so that an increase in temperature may cause the characteristics of an amplifying operation to change. As the area of a bump in the planar view of the main surface 111 increases, the area of adhesion to the module board increases, so that the amount of heat radiated through the bump increases. However, as the bump area increases, the chip area increases accordingly.

In this respect, according to the semiconductor chip 100A, the bumps 121, 122a, 122b, and 123a to 123d, which are connected to the emitter of the transistor in the first stage generating a relatively great amount of heat, and to the collector and the emitter of the transistor Q2 in the subsequent stage generating a greater amount of heat have rectangular shapes, and the bump 120 connected to the collector of the transistor Q1 in the first stage has the circular shape. Thus, the area of each of the bumps 121, 122a, 122b, and 123a to 123d is larger than the area of the bump 120, resulting in a great amount of heat radiated through the bumps. Hence, the semiconductor chip 100A can restrain the influence of the heat generated by transistors while achieving a reduced mounting area, as compared with a configuration that does not use the flip chip technology.

In the present embodiment, the bump 120 to which the collector of the transistor Q1 is connected is circular. However, the bump 120 may be rectangular rather than being circular. Further, the bumps 121, 122a, 122b, and 123a to 123d may be oval rather than being rectangular.

Figure 3:
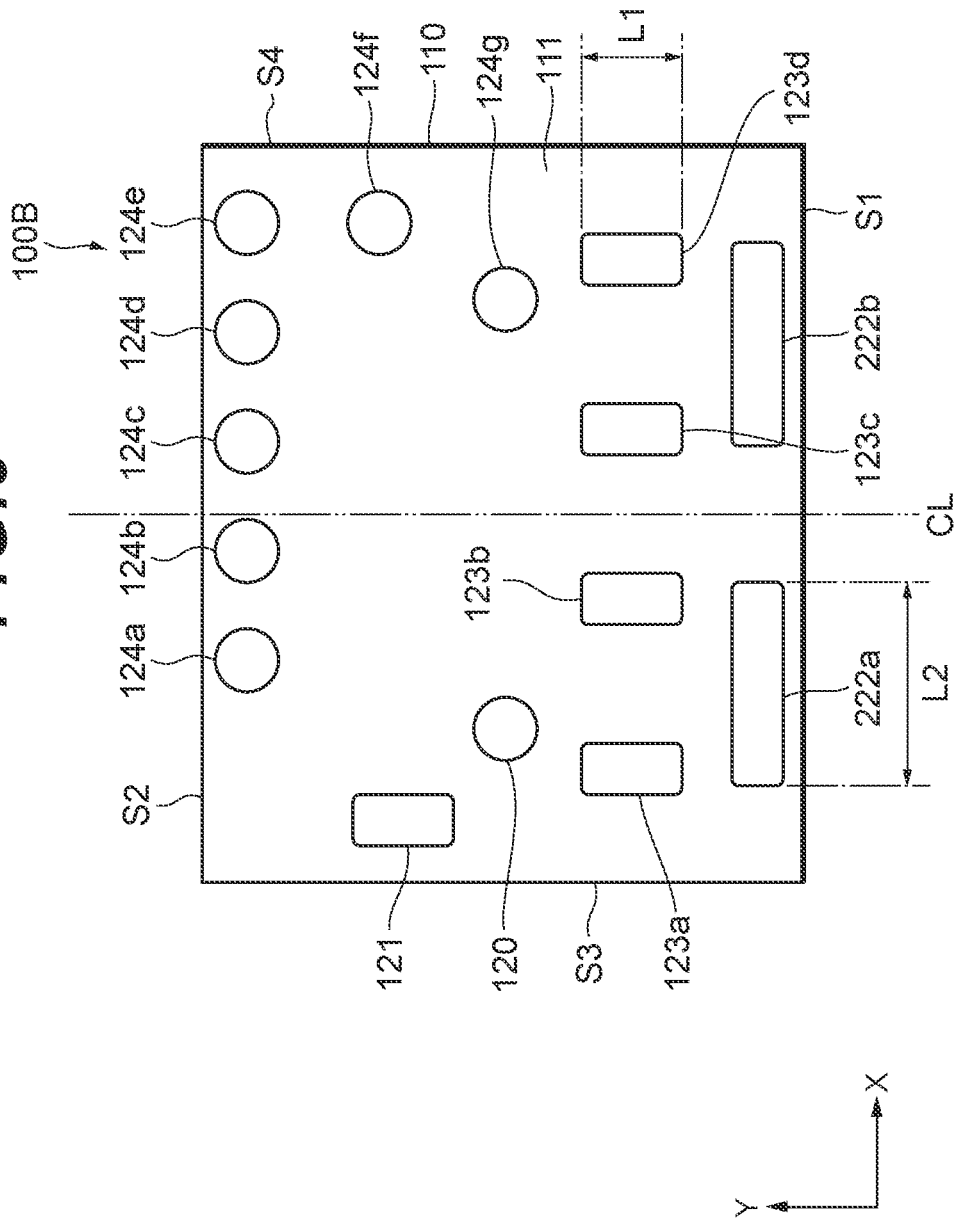
FIG. 3 is a plan view illustrating a semiconductor chip according to a second embodiment of the present disclosure.

FIG. 3 is a plan view of a semiconductor chip according to a second embodiment of the present disclosure. A semiconductor chip 100B illustrated in FIG. 3 differs from the semiconductor chip 100A illustrated in FIG. 2 in the shapes of bumps connected to the collector of a transistor Q2. More specifically, the semiconductor chip 100B includes bumps 222a and 222b in place of the bumps 122a and 122b.

As with the bumps 122a and 122b, the bumps 222a (a first part of a third bump) and 222b (a second part of the third bump) are connected to the collector of the transistor Q2, and outputs an amplified signal RF3, which is output from the transistor Q2, to an element outside the semiconductor chip 100B. Further, each of the bumps 222a and 222b is disposed such that the long side direction in the vicinity of a side S1 is substantially parallel to an X-axis. A length L2 of the long side direction (the X-axis direction in FIG. 3) of each of the bumps 222a and 222b is greater than a length L1 of the long side direction (a Y-axis direction in FIG. 3) of each of bumps 123a to 123d, to which the emitter of the transistor Q2 is connected. Thus, the semiconductor chip 100B provides further improved effect of heat dissipation, as compared with the semiconductor chip 100A.

Figure 4:
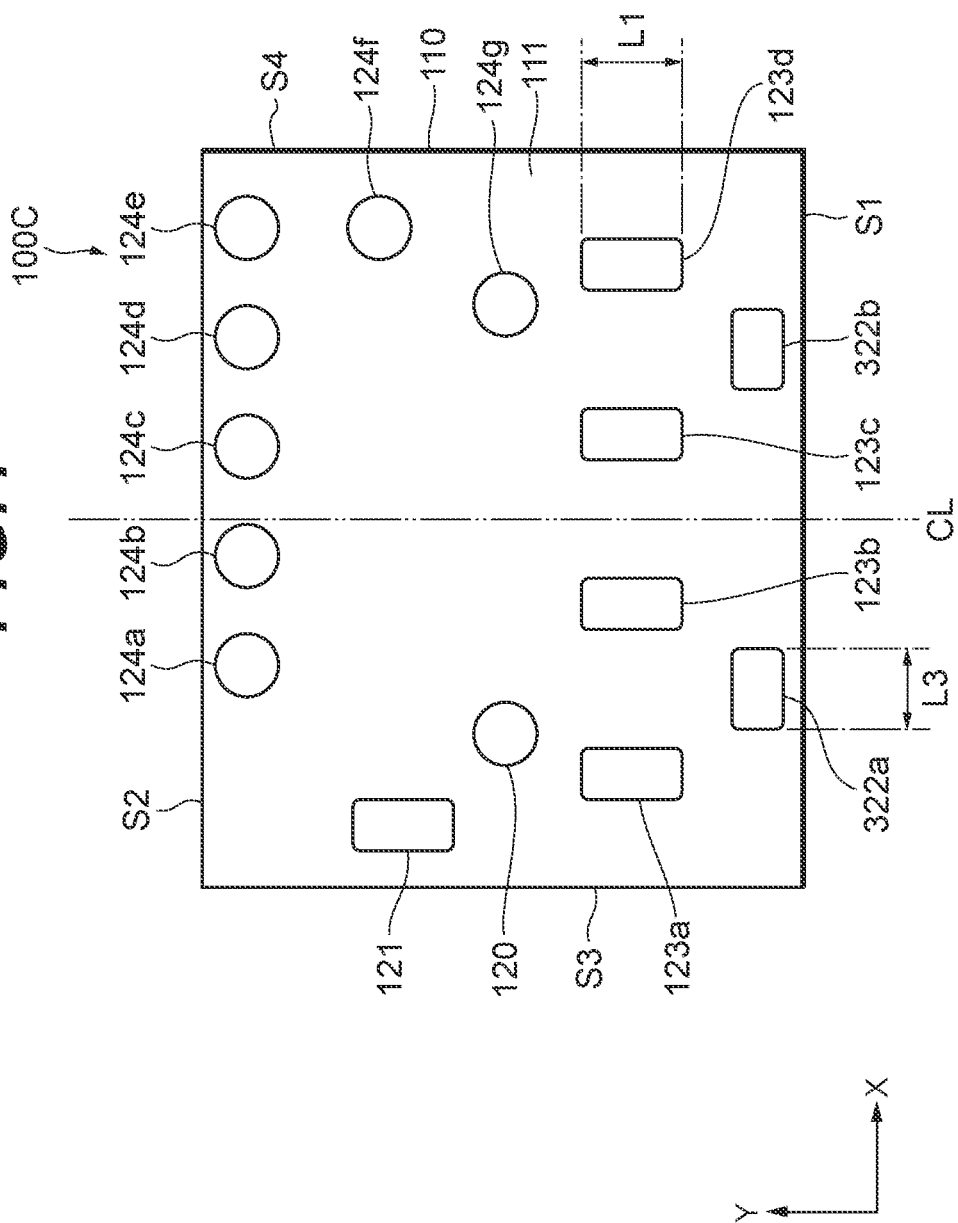
FIG. 4 is a plan view illustrating a semiconductor chip according to a third embodiment of the present disclosure.

FIG. 4 is a plan view of a semiconductor chip according to a third embodiment of the present disclosure. A semiconductor chip 100C illustrated in FIG. 4 differs from the semiconductor chip 100A illustrated in FIG. 2 in the shapes of bumps connected to the collector of a transistor Q2. More specifically, the semiconductor chip 100C includes bumps 322a and 322b in place of the bumps 122a and 122b.

As with the bumps 122a and 122b, the bumps 322a (a first part of a third bump) and 322b (a second part of the third bump) are connected to the collector of the transistor Q2, and outputs an amplified signal RF3, which is output from the transistor Q2, to an element outside the semiconductor chip 100C. Further, each of the bumps 322a and 322b is disposed such that the long side direction in the vicinity of a side S1 is substantially parallel to an X-axis. A length L3 of the long side direction (the X-axis direction in FIG. 3) of each of the bumps 322a and 322b is smaller than a length L1 of the long side direction (the Y-axis direction in FIG. 3) of each of bumps 123a to 123d, to which the emitter of the transistor Q2 is connected.

In other words, for heat dissipation, the areas of the bumps connected to the collector are desirably larger, as with the semiconductor chip 100B described above. However, bumps having larger areas usually tend to have greater bump thicknesses (i.e. a greater height in the normal direction of a main surface 111). Hence, if the area of a bump formed in the vicinity of the side S1 were excessively large, then the thickness of the bump might become greater than the thickness of each of bumps 124a to 124e formed in the vicinity of a side S2, which is a side opposing the side S1. In this case, the uneven thicknesses of the bumps tend to cause, for example, the bumps 124a to 124e having smaller areas to come off a module board, frequently leading to poor connection or the like.

In this respect, the semiconductor chip 100C prevents the areas of the bumps 322a and 322b from becoming excessively larger than the areas of the bumps 124a to 124e. Thus, poor contact will be reduced, resulting in improved mountability of the semiconductor chip 100C at the time of mounting.

FIG. 4 illustrates an example in which the number of bumps 322a and 322b, is two. However, the number of the bumps may be three or more. As the number of the bumps increases, the area of each bump can be reduced, thus making it easier to prevent the unevenness in height relative to the bumps 124a to 124e formed in the vicinity of an opposing side.

Figure 5:
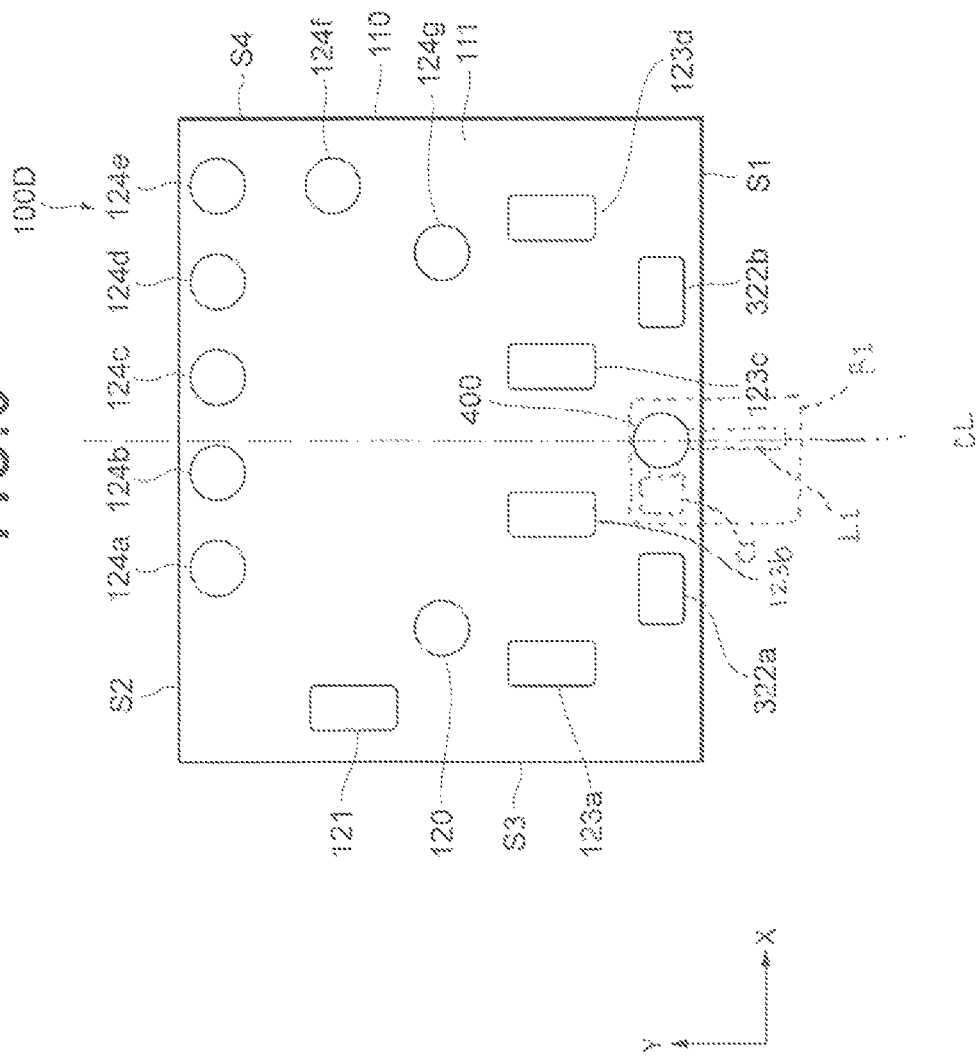
FIG. 5 is a plan view illustrating a semiconductor chip according to a fourth embodiment of the present disclosure.

FIG. 5 is a plan view of a semiconductor chip according to a fourth embodiment of the present disclosure. A semiconductor chip 100D illustrated in FIG. 5 includes an additional bump 400, as compared with the semiconductor chip 100C illustrated in FIG. 4.

The bump 400 (a sixth bump) is electrically connected to a part of a harmonic termination circuit F1, which is a specific example of a filter circuit which attenuates a harmonic (e.g. a second harmonic, a third harmonic, or a fourth harmonic) of an amplified signal RF3 output from the collector of a transistor Q2. More specifically, if, for example, the harmonic termination circuit F1 is composed of a capacitor C1 and an inductor L1 connected in series, then the bump 400 may be a terminal that connects a capacitor C1 formed on a semiconductor substrate 110 and an inductor L1 formed on a module board. As illustrated in FIG. 5, the bump 400 is provided on a main surface 111 of the semiconductor substrate 110 and is circular in the planar view of the main surface 111. Further, the bump 400 is disposed, for example, between a bump 322a (a first part of a third bump) and a bump 322b (a second part of the third bump) in the vicinity of a side S1 and a centerline CL. Thus, placing the bump 400 in the vicinity of the center in the X-axis direction sets uniform lengths of the paths from a plurality of fingers constituting the transistor Q2 to the harmonic termination circuit F1. This restrains a change in the characteristics of the harmonic termination circuit F1 caused by uneven lengths of the paths.

In the present embodiment, the bump 400 is circular. However, the bump 400 may alternatively be rectangular or oval rather than being circular.

Figure 6:
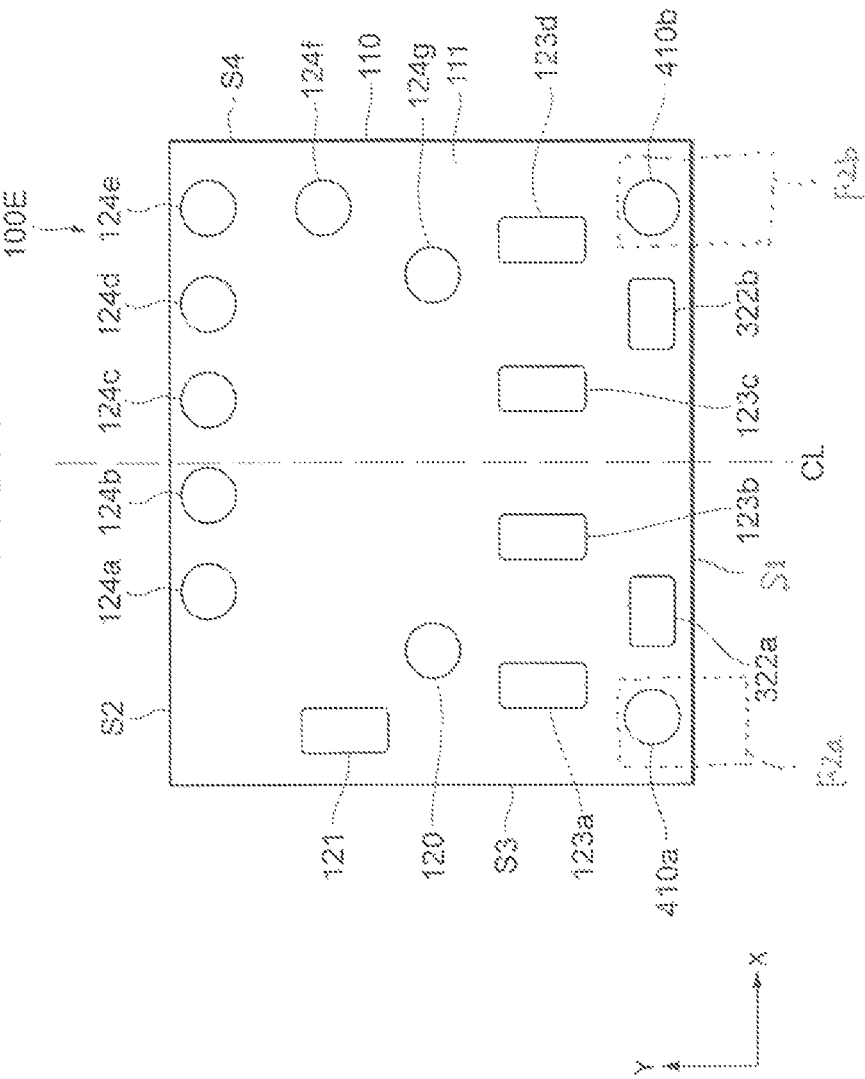
FIG. 6 is a plan view illustrating a semiconductor chip according to a fifth embodiment of the present disclosure.

FIG. 6 is a plan view of a semiconductor chip according to a fifth embodiment of the present disclosure. A semiconductor chip 100E illustrated in FIG. 6 differs from the semiconductor chip 100D illustrated in FIG. 5 in that the semiconductor chip 100E includes bumps 410a and 410b in place of the bump 400.

The bumps 410a (a first part of a sixth bump) and 410b (a second part of the sixth bump) are separately formed, and electrically connected to a part of a harmonic termination circuit F2a and F2b that attenuates the harmonic of an amplified signal RF3 output from the collector of a transistor Q2, as with the bump 400. In other words, it is assumed that the semiconductor chip 100E is configured to have two harmonic termination circuits. As illustrated in FIG. 6, the bumps 410a and 410b are provided on a main surface 111 of a semiconductor substrate 110 and are circular in the planar view of the main surface 111. Further, the bumps 410a and 410b are disposed, for example, substantially symmetrically with respect to a centerline CL in the vicinity of a side S1. Thus, placing the two bumps, 410a and 410b, substantially symmetrically with respect to the centerline CL shortens the length of the path from each finger to each harmonic termination circuit with resultant further uniform length of path, as compared with the semiconductor chip 100D.

In the present embodiment, the bumps 410a and 410b are circular. However, the bumps 410a and 410b may alternatively be rectangular or oval rather than being circular.

Further, in the present embodiment, bumps 322a and 322b are disposed between the bumps 410a and 410b. Alternatively, however, the bumps 410a and 410b may be disposed between the bumps 322a and 322b. Further, both the two harmonic termination circuits in the present embodiment may be designed to terminate harmonics of the same frequency (e.g. a second harmonic), or to terminate harmonics of different frequencies (e.g. the second harmonic and a third harmonic).

Figure 7:
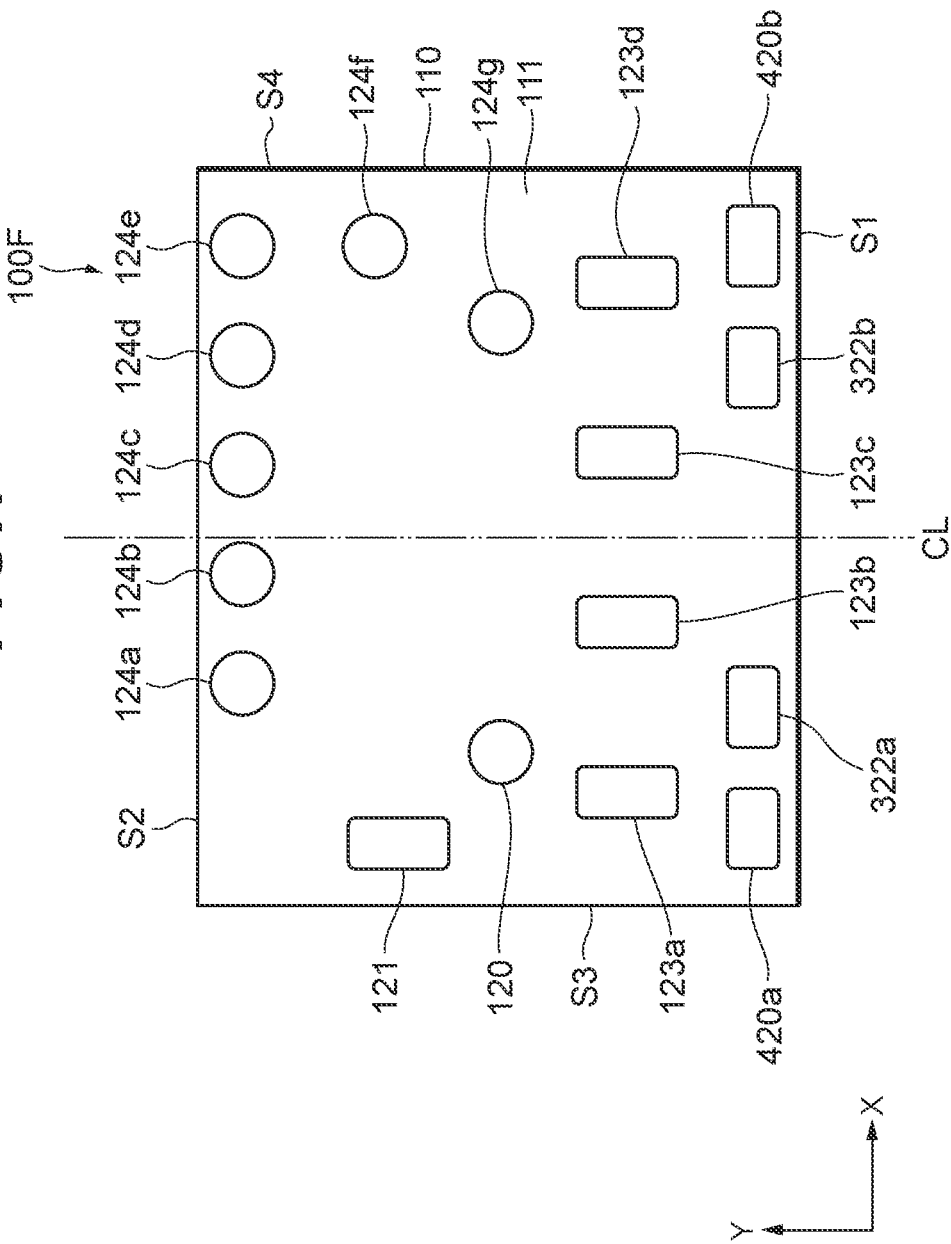
FIG. 7 is a plan view illustrating a semiconductor chip according to a sixth embodiment of the present disclosure.

FIG. 7 is a plan view of a semiconductor chip according to a sixth embodiment of the present disclosure. A semiconductor chip 100F illustrated in FIG. 7 differs from the semiconductor chip 100E illustrated in FIG. 6 in the shapes of bumps connected to a part of a harmonic termination circuit. More specifically, the semiconductor chip 100F includes bumps 420a and 420b in place of bumps 410a and 410b.

The bumps 420a (a first part of a sixth bump) and 420b (a second part of the sixth bump) are separately formed, and electrically connected to a part of a harmonic termination circuit that attenuates the harmonic of an amplified signal RF3 output from the collector of a transistor Q2, as with the bumps 410a and 410b. As with the bumps 322a and 322b, each of the bumps 420a and 420b is shaped like a rectangle that has a long side direction parallel to the X-axis and a short side direction parallel to the Y-axis in the planar view of the main surface 111. Thus, configuring the bumps 420a and 420b to have the same shapes as those of the bumps 322a and 322b makes it easy to match the thicknesses of the bumps 420a and 420b with the thicknesses of the bumps 322a and 322b. Hence, the semiconductor chip 100F exhibits improved mountability over the semiconductor chip 100E when mounting the semiconductor chip.

Figure 8:
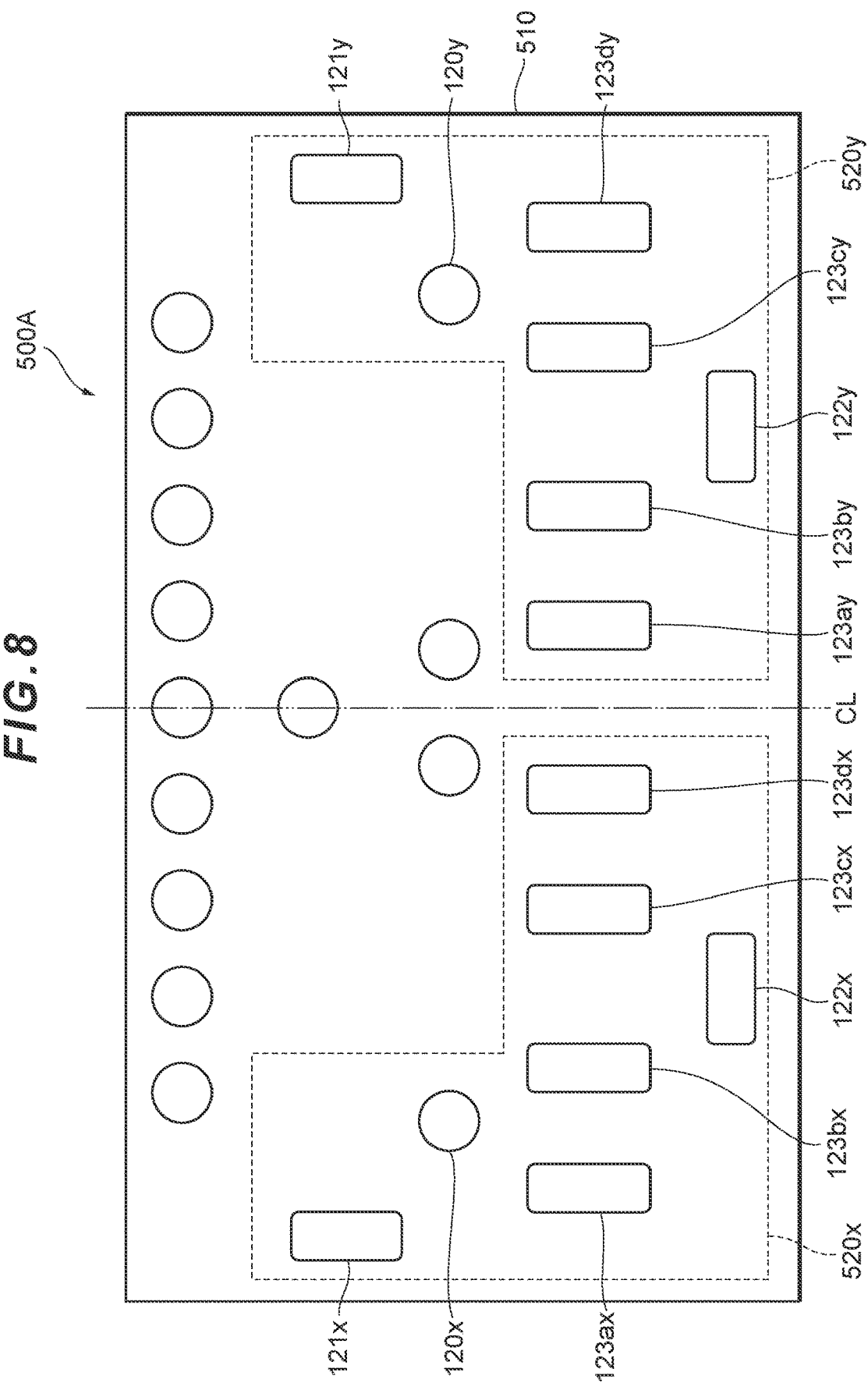
FIG. 8 is a plan view illustrating a semiconductor chip according to a seventh embodiment of the present disclosure.

FIG. 8 is a plan view of a semiconductor chip according to a seventh embodiment of the present disclosure. A semiconductor chip 500A illustrated in FIG. 8 has two sets of the power amplifier circuit 10 illustrated in FIG. 1. Regarding the semiconductor chip 500A, a description will be given of only the bumps connected to the terminals of transistors corresponding to the transistors Q1 and Q2 included in the power amplifier circuit 10, and no description will be given of other bumps (corresponding to the bumps 124a to 124g in FIG. 2).

The semiconductor chip 500A has two regions 520x and 520y, which are symmetrical with respect to a centerline CL in the X-axis direction, on a semiconductor substrate 510. One region, namely, the region 520x, has bumps 120x, 121x, 122x, and 123ax to 123dx. Similarly, the region 520y has bumps 120y, 121y, 122y, and 123ay to 123dy. The bumps provided in these two regions, 520x and 520y, correspond to the bumps 120, 121, 122a, 122b, and 123a to 123d illustrated in FIG. 2, so that no detailed description will be given.

In the semiconductor chip 500A, a power amplifier circuit is formed in each of the two regions, 520x and 520y. Providing the semiconductor chip 500A with two power amplifier circuits makes it possible to selectively use the amplifier circuits according to, for example, the frequency band (e.g. a high band, a middle band or a low band) of an input signal RF1. Alternatively, the amplifier circuits may be selectively used according to the communication standard (e.g. a second generation mobile communication system (2G), a third generation mobile communication system (3G), or a fourth generation mobile communication system (4G)) of the input signal RF1. The power amplifier circuits may be configured such that, if the power amplifier circuit formed in one of the regions 520x and 520y is operated, then the operation of the power amplifier circuit formed in the other region is stopped.

In the semiconductor chip 500A having the foregoing configuration also, the areas of the bumps 121x, 121y, 122x, 122y, 123ax to 123dx, and 123ay to 123dy connected to the emitter of a transistor in a first stage, the collector of a transistor in a subsequent stage, and the emitter of the transistor in the subsequent stage, which have relatively large amounts of heat generation, are larger than the areas of the bumps 120x and 120y connected to the collector of the transistor in the first stage. Thus, as with the semiconductor chip 100A, the mounting area can be reduced and the influence of the heat generation of the transistors can be restrained. The number of the bumps connected to the collector of the transistor in the subsequent stage may be one per power amplifier circuit, as illustrated in FIG. 8, or may be more than one, as illustrated in FIG. 2.

Figure 9:
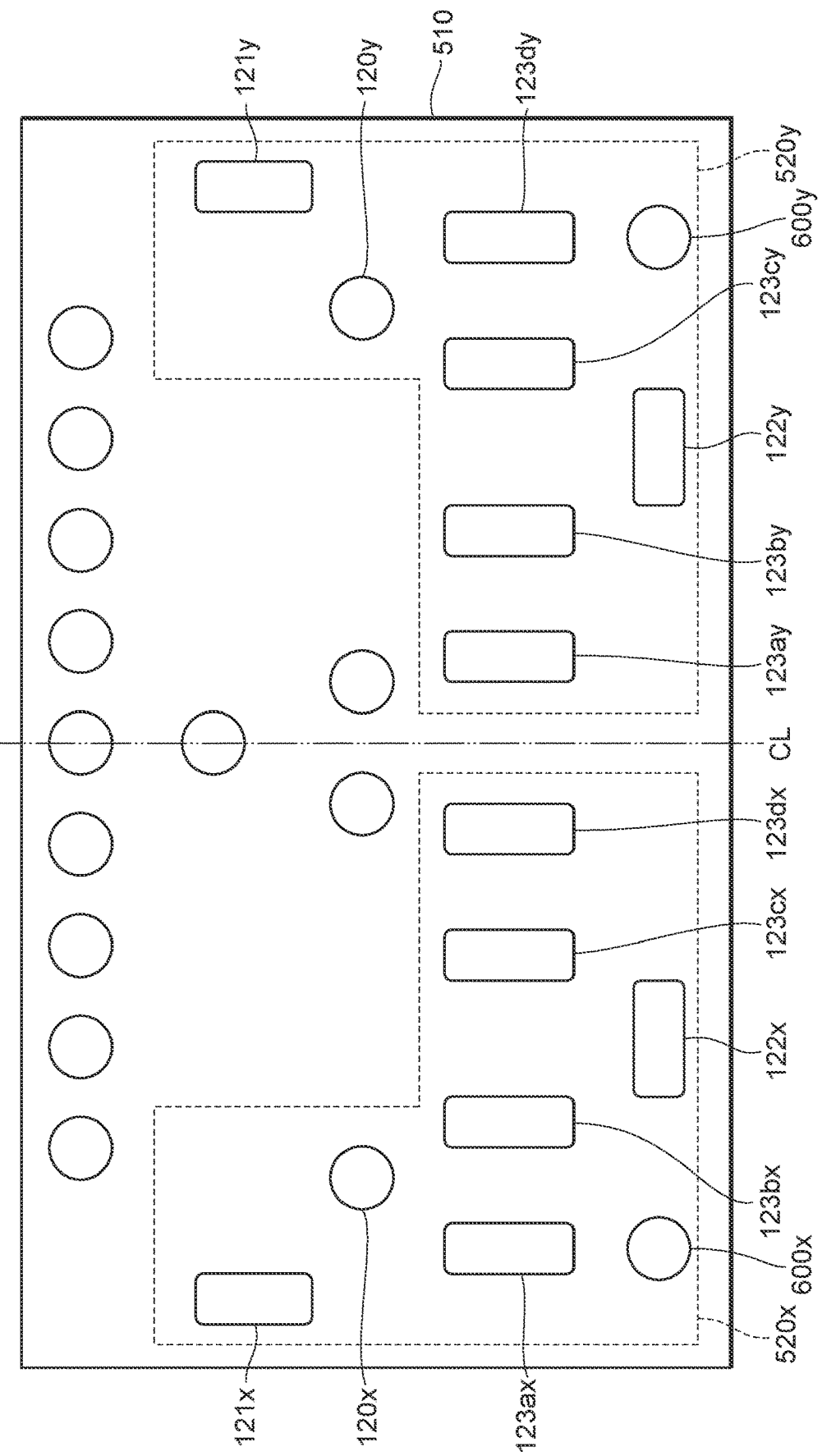
FIG. 9 is a plan view illustrating a semiconductor chip according to an eighth embodiment of the present disclosure.

FIG. 9 is a plan view of a semiconductor chip according to an eighth embodiment of the present disclosure. A semiconductor chip 500B illustrated in FIG. 9 differs from the semiconductor chip 500A illustrated in FIG. 8 in that the semiconductor chip 500B has additional bumps, 600x and 600y.

The bumps 600x and 600y are provided in regions 520x and 520y, respectively, of a semiconductor substrate 510. As with the bump 400 illustrated in FIG. 5, the bumps 600x and 600y are electrically connected with a part of a harmonic termination circuit which attenuates the harmonic of an amplified signal RF3 output from the collector of a transistor in a subsequent stage.

The foregoing configuration enables the semiconductor chip 500B to provide the same advantages as those of the semiconductor chip 500A. The number of the harmonic termination circuits included in the power amplifier circuit may be one per power amplifier circuit, as illustrated in FIG. 9, or may be more than one, as illustrated in FIG. 6. Further, in the present embodiment, the bumps 600x and 600y are circular. However, the bumps 600x and 600y may be rectangular or oval rather than being circular.

Figure 10:
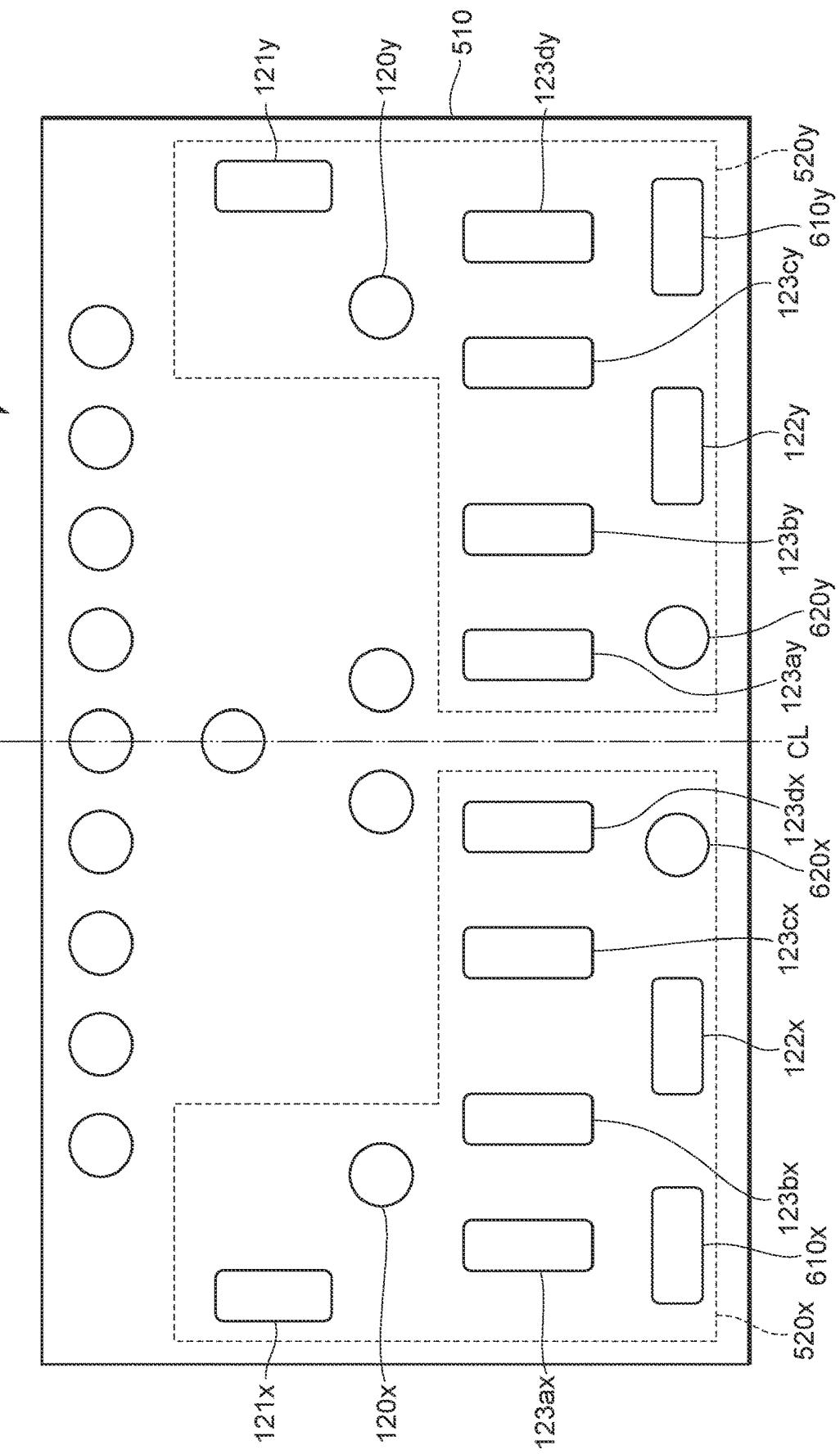
FIG. 10 is a plan view illustrating a semiconductor chip according to a ninth embodiment of the present disclosure.

FIG. 10 is a plan view of a semiconductor chip according to a ninth embodiment of the present disclosure. A semiconductor chip 500C illustrated in FIG. 10 differs from the semiconductor chip 500A illustrated in FIG. 8 in that the semiconductor chip 500C includes further additional bumps, 610x, 620x, 610y and 620y.

The bumps 610x and 620x are provided in a region 520x of a semiconductor substrate 510. The bumps 610y and 620y are provided in a region 520y of the semiconductor substrate 510. As with the bump 400 illustrated in FIG. 5, all the bumps 610x, 620x, 610y, and 620y are electrically connected to a part of a harmonic termination circuit that attenuates the harmonic of an amplified signal RF3 output from the collector of a transistor in a subsequent stage. In other words, as with the semiconductor chip 100E, it is assumed that the semiconductor chip 500C is configured to have two harmonic termination circuits per power amplifier circuit.

The foregoing configuration enables the semiconductor chip 500C to provide the same advantages as those of the semiconductor chip 500A. Further, as illustrated in FIG. 10, the bumps connected to the harmonic termination circuit may have a combination of various shapes, such as a circular shape, a rectangular shape and an oval shape.

The above has described illustrative embodiments of the present disclosure. In the semiconductor chips 100A to 100F and 500A to 500C, the bump 120 connected to the collector or the drain of the transistor Q1 of the first stage, the bump 121 connected to the emitter or the source of the transistor Q1 in the first stage, the bumps 122a and 122b (222a, 222b, 322a, 322b, 122x, and 122y) connected to the collector or the drain of the transistor Q2 in the subsequent stage, and the bumps 123a to 123d (123ax to 123dx and 123ay to 123dy) connected to the emitter or the source of the transistor Q2 in the subsequent stage are provided on the main surfaces of the semiconductor substrate 110 and 510. In the planar view of the main surfaces of the semiconductor substrates 110 and 510, the bump 120 is circular, and the bumps 121, 122a, 122b, and 123a to 123d are rectangular or oval. The areas of all the bumps 121, 122a, 122b, and 123a to 123d are larger than the area of the bump 120. Thus, the amount of heat dissipated through the bumps 121, 122a, 122b, and 123a to 123d is greater than the amount of heat dissipated through the bump 120. Accordingly, the semiconductor chips 100A to 100F and 500A to 500C are capable of achieving a reduced mounting area and restraining the influence of heat generated by transistors, as compared with configurations that do not use the flip chip technology.

Further, in the semiconductor chips 100A to 100F and 500A to 500C, the bumps 122a and 122b (222a, 222b, 322a, 322b, 122x, and 122y) are disposed in the vicinity of the side S1, which is one of the sides of the semiconductor substrate 110 or 510, such that the long side directions thereof are substantially parallel to the side S1. This arrangement shortens the path for outputting the amplified signal RF3, which is output from the transistor Q2, to the outside of the semiconductor chip, thus reducing a loss.

Also, in the semiconductor chips 100C to 100F, the bumps 124a to 124e are provided in the vicinity of the side S2, which is the side opposing the side S1, the areas of the bumps 322a and 322b are larger than the areas of the bumps 124a to 124e, and the lengths in the long side direction of the bumps 322a and 322b are smaller than the lengths in the long side direction of the bumps 123a to 123d. This prevents the areas of the bumps 322a and 322b from becoming excessively large in comparison with the areas of the bumps 124a to 124e. Thus, poor contact is prevented, and the mountability of the semiconductor chips at the time of mounting is improved.

In addition, in the semiconductor chip 100D, the bump 400 connected to a part of the harmonic termination circuit is further provided. The bumps 322a and 322b are disposed in the vicinity of the side S1 and substantially symmetrical with respect to the centerline CL in the X-axis direction, and the bump 400 is disposed between the bumps 322a and 322b in the vicinity of the side S1 and also in the vicinity of the centerline CL. Thus, the lengths of the paths from the plurality of fingers constituting the transistor Q2 to the harmonic termination circuit are made uniform. Hence, a change in the characteristics of the harmonic termination circuit caused by variations in length of the paths is restrained.

Further, in the semiconductor chips 100E and 100F, the bumps 410a and 410b (420a and 420b) connected to a part of the harmonic termination circuit are further provided. The bumps 410a and 410b (420a and 420b) are disposed substantially symmetrically with respect to the centerline CL in the X-axis direction in the vicinity of the side S1, and the bumps 322a and 322b are disposed between the bumps 410a and 410b (420a and 420b). Thus, according to the semiconductor chips 100E and 100F, the lengths of the paths from the individual fingers to the individual harmonic termination circuits are shortened, and the lengths are made further uniform, as compared with the semiconductor chip 100D. Also, in the semiconductor chips 100A to 100F and 500A to 500C, the long side directions of, for example, the bumps 122a and 122b (222a, 222b, 322a, 322b, 122x, and 122y) and the long side directions of the bumps 123a to 123d (123ax to 123dx and 123ay to 123dy) may be orthogonal to each other.

The embodiments described above are intended for easy understanding of the present disclosure, and are not to be considered as limiting. The present disclosure can be modified or improved without departing from the spirit thereof, and the present disclosure covers equivalents thereof. More specifically, anything obtained by adding design alterations, as necessary, to the embodiments by persons skilled in the art will be encompassed by the scope of the present disclosure insofar as the features of the present disclosure are included. For example, the elements used in the embodiments and the placement, the materials, the conditions, the shapes, the sizes, and the like of the elements are not limited to those illustrated and may be changed, as appropriate. Further, the elements used in the embodiments can be combined insofar as the combinations are technically feasible. These combinations are to be covered by the scope of the present disclosure insofar as the features of the present disclosure are included.

What is claimed is:

1. A semiconductor chip comprising:
   a first transistor which amplifies a first signal and outputs a second signal;
   a second transistor which amplifies the second signal and outputs a third signal; and
   a semiconductor substrate which has a main surface parallel to a plane defined by a first direction and a second direction intersecting with the first direction and which has the first transistor and the second transistor formed thereon, the main surface of the semiconductor substrate that has a first side and a second side, which are parallel to the first direction, and a third side and a fourth side, which are parallel to the second direction, a centerline of the chip being provided at a point that is a midpoint between the third side and the fourth side and the centerline intersecting each of the first side and the second side, the main surface of the semiconductor substrate being provided with:
  a first bump electrically connected to a collector or a drain of the first transistor;
  a second bump electrically connected to an emitter or a source of the first transistor;
  a third bump electrically connected to a collector or a drain of the second transistor;
  a fourth bump electrically connected to an emitter or a source of the second transistor;
  wherein
in a planar view of the main surface of the semiconductor substrate,
  an area of each of the second and the fourth bumps is larger than an area of the first bump, and
  the third bump is disposed closer to the first side than to the second side, such that a long side direction of the third bump is substantially parallel to the first direction,
the third bump includes a first part and a second part which are separately formed, and
in the planar view of the main surface of the semiconductor substrate,
  an entirety of the first part of the third bump, and an entirety of the second part of the third bump are disposed closer to the first side than to the second side.

2. The semiconductor chip according to claim 1, wherein:
an area of the fourth bump is larger than an area of the third bump.

3. The semiconductor chip according to claim 1, wherein:
a length of the third bump in the long side direction is smaller than a length of the fourth bump in the long side direction.

4. The semiconductor chip according to claim 1, wherein:
in the planar view of the main surface of the semiconductor substrate,
  the first part and the second part of the third bump are disposed substantially symmetrically with respect to the centerline.

5. The semiconductor chip according to claim 1, wherein:
an area of the third bump is larger than an area of the first bump.

6. The semiconductor chip according to claim 1, wherein:
a fifth bump is provided on the main surface of the semiconductor substrate closer to the second side than to the first side.

7. The semiconductor chip according to claim 6, wherein
in the planar view of the main surface of the semiconductor substrate,
  the area of the third bump is larger than an area of the fifth bump.

8. The semiconductor chip according to claim 6, wherein
in the planar view of the main surface of the semiconductor substrate,
  the area of the fourth bump is larger than an area of the fifth bump.

9. The semiconductor chip according to claim 6, wherein the fifth bump includes a plurality of parts which are separately formed.

10. The semiconductor chip according to claim 6, wherein the fifth bump functions as the terminal for supplying a supply voltage from outside the semiconductor chip.

11. The semiconductor chip according to claim 6, wherein the fifth bump functions as the terminal for supplying an input signal from outside the semiconductor chip.

12. The semiconductor chip according to claim 6, wherein the fifth bump functions as the terminal for supplying a ground potential from outside the semiconductor chip.

13. The semiconductor chip according to claim 6, wherein the fifth bump functions as the terminal for supplying a control signal from outside the semiconductor chip.

14. A semiconductor chip comprising:
a first transistor which amplifies a first signal and outputs a second signal;
a second transistor which amplifies the second signal and outputs a third signal; and
a semiconductor substrate which has a main surface parallel to a plane defined by a first direction and a second direction intersecting with the first direction and which has the first transistor and the second transistor formed thereon, the main surface of the semiconductor substrate that has a first side and a second side, which are parallel to the first direction, and a third side and a fourth side, which are parallel to the second direction, a centerline of the chip being provided at a point that is a midpoint between the third side and the fourth side and the centerline intersecting each of the first side and the second side, the main surface of the semiconductor substrate being provided with:
  a first bump electrically connected to a collector or a drain of the first transistor;
  a second bump electrically connected to an emitter or a source of the first transistor;
  a third bump electrically connected to a collector or a drain of the second transistor;
  a fourth bump electrically connected to an emitter or a source of the second transistor;
  wherein
in a planar view of the main surface of the semiconductor substrate,
  an area of each of the second and the fourth bumps is larger than an area of the first bump, and
  the third bump is disposed closer to the first side than to the second side, such that a long side direction of the third bump is substantially parallel to the first direction,
the third bump includes a first part and a second part which are separately formed,
in the planar view of the main surface of the semiconductor substrate,
  the first part and the second part of the third bump are disposed closer to the first side than to the second side, and
in the planar view of the main surface of the semiconductor substrate,
  the first part and the second part of the third bump are disposed substantially symmetrically with respect to the centerline.

* * * * *